United States Patent [19]

Dietrich

[11] Patent Number: 4,686,556

[45] Date of Patent: Aug. 11, 1987

[54] PHOTOCATHODE FOR THE INFRA-RED RANGE

[76] Inventor: Klaus Dietrich, Paul-Keller-Str. 18, D-8035 Stockdorf, Fed. Rep. of Germany

[21] Appl. No.: 797,587

[22] Filed: Nov. 13, 1985

[30] Foreign Application Priority Data

Nov. 16, 1984 [DE] Fed. Rep. of Germany ....... 3441922

[51] Int. Cl.[4] .............................................. H01L 27/14

[52] U.S. Cl. ........................................ 357/30; 357/58; 357/65

[58] Field of Search ............... 357/30, 58, 52, 4, 30 B, 357/30 R, 30 F, 30 L, 30 P, 12, 30 Q, 16, 65

[56] References Cited

U.S. PATENT DOCUMENTS

| | | | |
|---|---|---|---|
| 3,150,282 | 9/1964 | Geppert | 357/52 X |
| 3,398,334 | 8/1968 | Shockley | 357/58 X |
| 4,591,893 | 5/1986 | Yamazaki | 357/30 |

*Primary Examiner*—Andrew J. James
*Assistant Examiner*—William A. Mintel
*Attorney, Agent, or Firm*—Townsend & Townsend

[57] ABSTRACT

The invention relates to a photocathode for the infrared range having a plurality of layers of semi-conductive and conductive material. The photocathode is transparent and sensitive in a spectral range of between approx. 1 and 20 μm. This is achieved by the following layer structure:

$p_1$: a highly doped p-layer
$n_2$: a highly doped n-layer
$i_3$: an intrinsic layer
$p_4$: a highly doped p-layer
$m_5$: a thin metal layer, preferably of an atomic layer of Cs.

The spectral sensitivity can be adjusted by applying a negative bias voltage to the layer $p_1$ with respect to the layer $P_4$. When this happens, the Fermi level of the layer $p_2$ is shifted and the work function of the electrons is reduced.

7 Claims, 8 Drawing Figures

FIG. 1
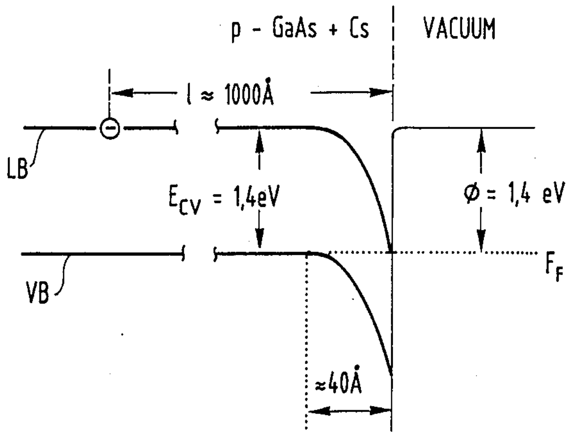
FIG. 2a
FIG. 2b
FIG. 2c
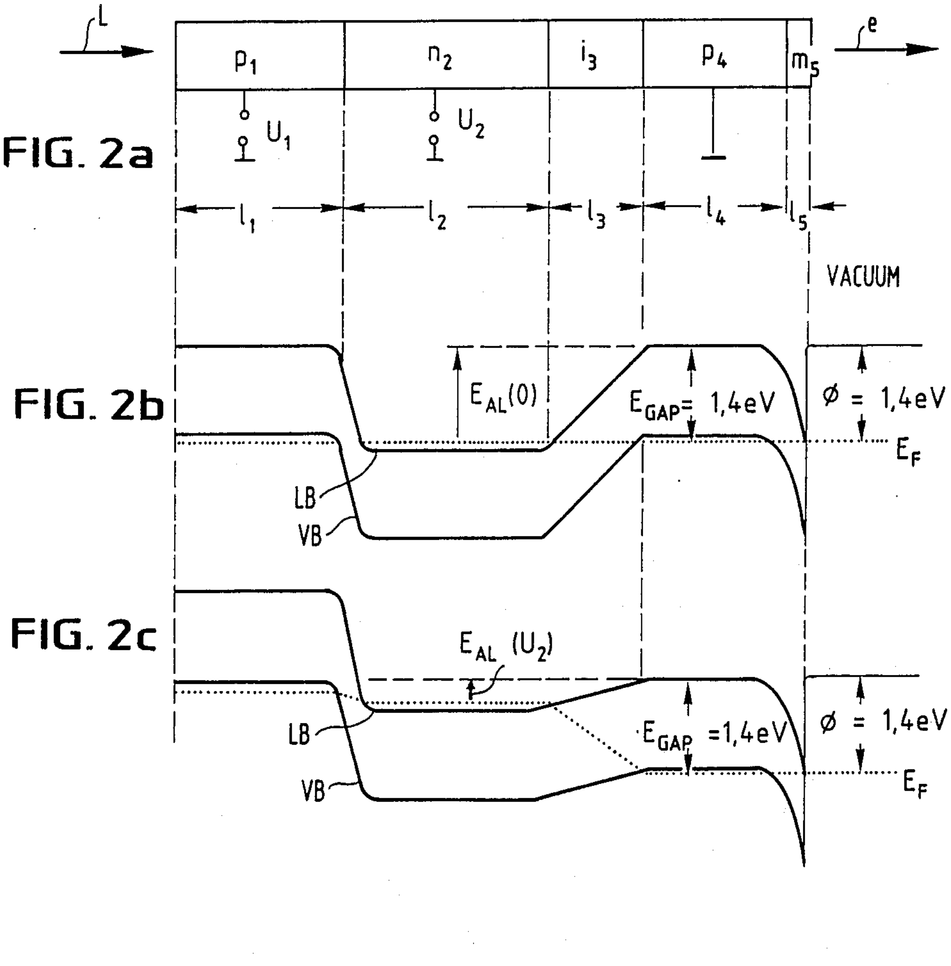

PHOTOCATHODE FOR THE INFRA-RED RANGE

The invention relates to a photocathode for the infra-red range, according to the preamble to claim 1.

Photo-multipliers and image intensifiers are the conventional photo-detectors having the highest sensitivity hitherto achieved, namely with a resolution of a few photons (light quanta). In these detectors, incident photons trigger electrons from photocathodes, in fact for wavelengths which are smaller than the limit infra-red wavelengths. This latter is determined either by the electron work function or indirectly by the valence-conduction band gap of the semi-conducting cathode material.

Hitherto, only two photocathodes of noteworthy infra-red sensitivity were known, namely the S1 photocathode with a spectral range of approx. 320 to 1,120 nm and a typical average quantum efficiency of 0.3% and the GaAs-Cs photocathode with a spectral range of approx. 160 to 920 nm and a typical mean quantum efficiency of 15%.

The extreme infra-red wavelength of these photocathodes, predetermined by the cathode material, therefore extends only into the near infra-red range. Consequently, these photo-detectors could not hitherto be used for recording heat images.

The object of the invention is to provide a photocathode which can be used in photo-multipliers and image intensifiers and which has a spectral range of approx. 1 to 20 $\mu$m and which is thus suitable for heat image cameras. Furthermore, it is intended that the infra-red absorption limit wavelength should be adjustable by an external voltage between approx. 1 to 20 $\mu$m according to the application so that the detector can be spectrally tuned. Furthermore, it is intended that the photocathode be suitable for operation in transmission, the electrons emitted by the photocathode moving in the direction of the incident light quants and also for use in reflection, the electrons emitted moving against the direction of the incident light quanta. Finally, it is intended that the detector have a single photon sensitivity so that each electron triggered by a photon from the photocathode is detectable.

According to the invention, this is achieved by the construction of a photocathode described in the characterising part of claim 1.

Details of the invention will become manifest from the claims and the description in which a plurality of examples of embodiment will be explained with reference to the accompanying drawings, in which FIG. 1 shows a typical potential pattern in a usual GaAs Cs photocathode (state of the art);

FIGS. 2*a* to 2*c* show the layer build-up and band structure of the photocathode according to the invention with and without tuning voltages applied;

FIG. 1 shows the typical potential pattern in a conventional GaAs-Cs photocathode (state of the art). For better understanding of the processes involved in the photo emission of electrons, these will be briefly explained with reference to the example of this known GaAs-Cs photocathode.

Figure 3:
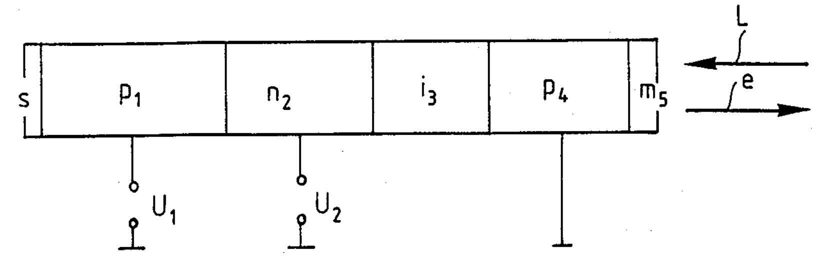
FIG. 3 shows the layer build-up through a tunable embodiment for reflection operation.

In the case of GaAs-Cs photocathodes, highly-doped p-conductive GaAs is used which is coated on the surface with a thin layer of metal, typically an atomic layer of caesium. This results in a band bending on the surface of the GaAs as shown in FIG. 1.

What is essential in this is that the work function for an electron from this cathode amounts to approx. $\phi=1.4$ eV and this value is equal to the band gap $E_{CV}=1.4$ eV in the GaAs. This means than an electron in the valence band and the Fermi characteristic level of the p-conductive material can, by absorption of a light quantum of energy $\phi=1.4$ eV (corresponds to approx. $\lambda(\phi)=900$ nm) be lifted into the conduction band LB and then already has the energy needed to pass out of the photocathode and into a vacuum or to recombine with a hole in the valence band VB.

By virtue of the high mobility (approx. 50,000 to 100,000 v/sq.cm) of the conduction band electrons and their long life of approx. $10^{-7}=10^{-8}$ seconds for conduction band/valence band transitions (recombination), the probability of a diffusion of a conduction band electron on the surface and thus cross-over into a vacuum is relatively high, even if the electron is generated in a GaAs layer of $\geqq 1{,}000$ Angstroms units. Further details on this point can be obtained in the literature; Festkorperprobleme X (Solids Problems X) Pergamon Press-/Vieweg 1970, pp. 175-187.

For light quanta with an energy $E<1.4$ eV ($\lambda>$ approx. 900 nm), GaAs shows no absorption, since excitation of valence band electrons is not possible by virtue of the prohibited conditions in the band gap. Photocathodes of this type are described as "cathodes of disappearing electron affinity".

FIG. 2 shows the layer build-up and the band structures of the photocathode according to the invention with and without tuning voltages applied.

The photocathode consists of semiconductive material, e.g. GaAs, having a layer sequence: $p_1$, $n_2$, $i_3$, $p_4$, $m_5$. These layers are $p_1$: a highly doped p-layer
$n_2$: a highly doped n-layer
$i_3$: an intrinsic layer
$p_4$: a highly doped p-layer
$m_5$: a thin metal layer.

Here, too, the work function is designated $\phi$ while $E_F$ represents the Fermi level.

The layer $m_5$ consists typically of an atomic layer of Cs, in order to produce band bending on the surface of $p_4$, which is necessary in order to make $p_4$ a "cathode of disappearing electron affinity". The work function $\phi$ is approximately equal to the band interval $E_{GAP}$.

The layers $p_1$,$n_1$ and $p_4$ are electrically contacted. The voltage at $p_4$ defines the potential of the photocathode. The voltages $U_1$ (at $p_1$) and $U_2$ (at $n_2$) are control signals for the spectral characteristics of the photocathode.

The transition $p_1/n_2$ is an abrupt transition from a high p-doping to a high n-doping with tunnel diode properties. The function of the $p_1$ layer is, by applying a negative bias voltage on layer $p_1$ relative to layer $n_2$ (see FIG. 2*c*) and by utilizing the tunnel effect, to inject charge carriers (electrons) rapidly and over a large area into the $n_2$ layer. For this purpose, the $p_1$ layer must be highly doped and relatively thick (e.g. 1 to 100 $\mu$m) in order to have a low internal resistance.

The absorption of infra-red light quanta takes place by excitation of free electrons in the conduction band of the $n_2$ layer, the light prior to absorption passing either through the $p_1$ layer or the layers $m_5$, $p_4$ and $i_3$. The layers $p_1$, $i_3$, $p_4$, $m_5$ are completely transparent to infra-red radiation with $E_{photon} < E_{GAP}$, and photon absorption is not possible there.

In order to achieve the highest possible photon absorption in the layer $n_2$, the n-doping of this layer must be as great as possible. Absorption of the $n_2$ layer is furthermore proportional to the thickness of the layer $l_2$, i.e. this thickness should be as great as possible. If a free electron in the $n_2$ layer absorbs the energy of a light quantum $E_{photon} \geqq E_{AL}$ (work function from the cathode), then the energised electron can either emerge through the layers $i_3$, $p_4$, $m_5$ into the vacuum or recombine with holes in the conduction band of the $n_2$ layer.

In order to obtain optimum quantum efficiency, the thickness of the layer $l_2$ must be optimised. This might be achieved when the probability of electron emergence of an electron of the $n_2$ layer in the vacuum lies in the order of probability of a recombination of the energised electron in the $n_2$ layer itself. The value for $l_2$ could be approx. 1,000 to 5,000 A. The tunnel transition to layer $p_1$ provides for the feed of charge carriers of layer $n_2$ for energised electrons and those emitted by the cathode.

The task of the $p_4$ layer is, together with the $m_5$ layer, to generate the typical conduction and valency band pattern for "cathodes of disappearing electron affinity". The layer thickness $l_4$ of $p_4$ must be kept as small as possible in order to prevent as little as possible the emission of sufficiently energised electrons from the $n_2$ layer into the vacuum, but it must be sufficiently thick that the potential of the layers $p_1$, $n_2$, $i_3$ and these layers themselves cannot interfere with band bending at the interface of layers $p_4/m_5$. Typical values for layer thickness $l_4$ are around 150 to 400 Angstroms.

Since the layers $n_2$ and $p_4$ are in each case highly doped zones, there is positioned between layers $n_2$ and $p_4$ a sufficiently thick intrinsic layer $i_3$ to avoid a tunnel current between the layers $n_2$ and $p_4$ when a bias voltage is applied on these layers.

Typical values for the layer thickness $i_3$ are about 150 to 300 A.

FIG. 2*b* shows the band model of this layer structure for external voltages $U_1 = U_2 = 0$ (relative to the voltage at $p_4$) of the layers $p_1$, $n_2$. In order to emit an electron out of the layer $n_2$ into a vacuum, the electron must absorb a light quantum of the energy $E_{photon} \geqq E_{GAP}$. At these applied bias voltages $U_1 = U_2 = 0$, the cathode has a spectra characteristic such as is known from the previous GaAs-Cs photocathodes. On the other hand, if a negative bias voltage is applied to layer $n_2$ $U_2 < 0$ relative to the layer $p_4$, then the Fermi level of the layer $n_2$ is shifted by this voltage amount and the work function for electrodes of layer $n_2$ reduces to $$E_{AL}(U_2) = E_{GAP} - |U_2|,$$

i.e. with increasing negative bias voltage applied to the diode formed from the layer sequence $n_2$, $i_3$, $p_4$ the work function for electrons of layer $n_2$ reduces and so the infra-red absorption edge is shifted towards greater wavelengths.

This means that by using the voltage $U_2$, the spectral characteristic of the photocathode can be adjusted to the desired spectral range.

The electrons of the layer $n_2$ are subject to the Fermi statistic. In order to achieve the sharpest possible Fermi edge (i.e. minimal inherent noise) of the detector, cooling of the detector is necessary is the longwave infra-red range.

The layer structure of this detector can be established over a large area by the available technical means and in the necessary quality (e.g. molecular beam epitaxy [MBE]).

FIG. 3 shows the layer build-up through a tunable embodiment for reflection operation. The arrangement corresponds to that in FIG. 2*a;* the only thing is that there is a mirror layer S on the layer $p_1$.

Figure 4:
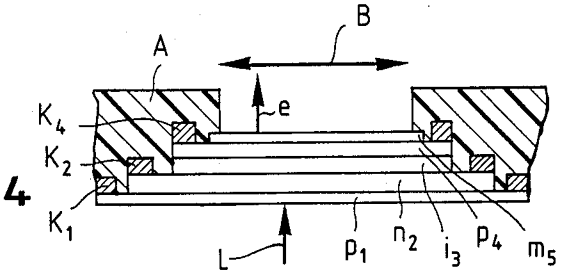
FIG. 4 shows a section through a tunable photocathode for transmission operation.

FIG. 4 shows a section through a tunable photocathode for transmission operation. It is built up from the previously described layers $p_1$, $n_2$, $i_3$, $p_4$ and $m_5$. The layers $p_1$, $n_2$ and $p_4$ are provided with contacts $K_1$, $K_2$ and $K_4$ which are disposed outside of the used detector area B. An electrode cover A embraces the layers.

One problem of this detector is still the low quantum efficiency for certain applications and which, in comparision with conventional semi-conductor detectors, is reduced by the ratio of conduction band electron density to valence band electron density. Therefore, for the $n_2$ layer, the highest possible doping is necessary so what this ratio amounts to approx. $10^{-3}$ to $10^{-2}$. The quantum efficiency which is reduced by this ratio is, in the typical image intensifier application of the photocathode according to the invention, certainly compensated in part by the high amplification factor (100 to 400×) of an image intensifier stage.

Figure 5:
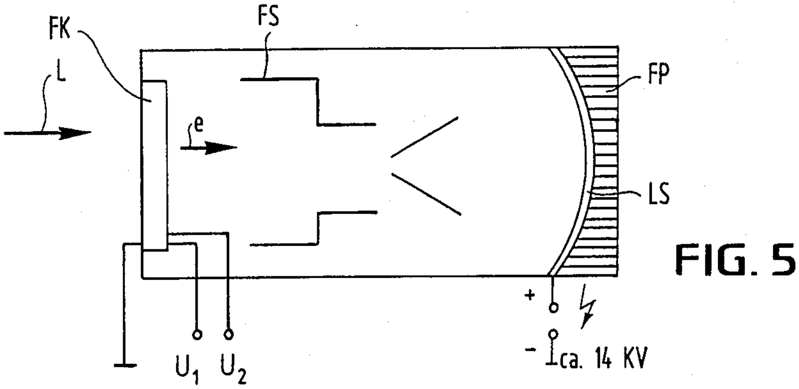
FIG. 5 shows a diagrammatic section through an image intensifier arrangement built up using the photocathode according to the invention.

Such an arrangement, the construction of which is known, is shown in FIG. 5. In an evacuated tube there is a light inlet window with the photocathode FK according to the invention. As described, voltages $U_1$ and $U_2$ are applied to its layers. The emitted electrons e are accelerated by the high voltage applied and they are directed by an electrostatic focusing system FS on the luminescent screen LS which serves as an anode and which consists of a suitable type of phosphorus where they produce an image. To compensate for the curvature of the luminescent screen LS, a fibre plate FP is used.

Figure 6:
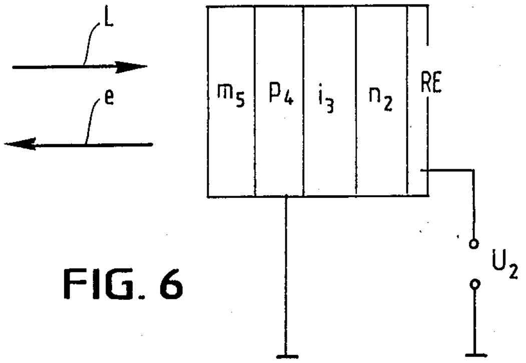
FIG. 6 shows the layer build-up through a tunable embodiment for reflection operation with a doubled quantum efficiency.

In the case of cathodes which are operated on the reflection principle, in other words where there is an incidence of light through the layers $m_5$, $p_4$ and $i_3$, the quantum efficiency can be doubled, if the non-absorbant light leaving the layer $p_1$ is reflected by a mirror and passes a second time through the detector. This arrangement is shown in FIG. 6. In this case, the $p_1$ layer is replaced by a reflective metal electrode RE.

I claim:

1. Photocathode for the infrared range, comprising a plurality of layers of semiconductive and conductive materials, forming a layer structure in which adjacent layers are arranged in the order of
   - a first, highly doped p-layer,
   - a second, highly doped n-layer,
   - a third, intrinsic layer,
   - a fourth, highly doped p-layer, and
   - a fifth, thin metal layer having a thickness of about an atomic layer of Cs, the first, second and fourth layers be biased by predetermined voltages, and wherein the term highly-doped means a carrier concentration of at least $10^{18}$ $cm^{-3}$.

2. Photocathode for the infrared range, comprising a plurality of layers of semiconductive and conductive materials forming a layer structure, in which adjacent layer are arranged in the order of a first, reflecting metal electrode, a second, highly doped n-layer, a third, intrinsic layer, a fourth, highly doped n-layer, and a fifth, thin metal layer having a thickness of about an atomic layer of Cs, the first, second and fourth layers be biased by predetermined voltages, and wherein the term highly-doped means a carrier concentration of at least $10^{18}$ $cm^{-3}$.

3. Photocathode according to claim 1, wherein the layers $p_1$, $n_2$ and $p_4$ are biased by different voltages, the voltage at $p_4$ defining the potential of the photocathode whereas at $p_1$ the voltage $U_1$ and at $n_2$ the voltage $U_2$ is controlling the spectral characteristics of the photocathode.

4. Photocathode according to claim 3, wherein a mirror layer S is deposited on the layer $p_1$.

5. Photocathode according to claim 2, wherein the layers RE and $p_4$ are biased by different voltages, the voltage at $p_4$ defining the potential of the photocathode while at RE the voltage $U_2$ controls the spectral characteristics of the photocathode.

6. Photocathode according to claim 1 or 2, wherein the carrier concentration from layer $p_1$ to layer $n_2$ changes abruptly from a high p-doping to a high n-doping with tunnel diode properties and wherein the thickness of the layer $p_1$ is between 1 and 100 $\mu$m, while said high doping corresponds to a carrier concentration of at least $10^{18}$ $cm^{-3}$.

7. Photocathode according to claim 1 or 2, wherein the thickness of the layer $p_4$ lies between 10 and 50 nm.

* * * * *